US010186748B2

(12) United States Patent
Fleancu et al.

(10) Patent No.: US 10,186,748 B2
(45) Date of Patent: Jan. 22, 2019

(54) MOBILE RADIO ANTENNA

(71) Applicant: KATHREIN-WERKE KG, Rosenheim (DE)

(72) Inventors: Dan Fleancu, Griesstätt (DE); Manfred Stolle, Bad Aibling (DE)

(73) Assignee: Kathrein SE, Rosenheim (DE)

( * ) Notice: Subject to any disclaimer, the term of this patent is extended or adjusted under 35 U.S.C. 154(b) by 0 days.

(21) Appl. No.: 15/311,318

(22) PCT Filed: May 7, 2015

(86) PCT No.: PCT/EP2015/000933
§ 371 (c)(1),
(2) Date: Nov. 15, 2016

(87) PCT Pub. No.: WO2015/172871
PCT Pub. Date: Nov. 19, 2015

(65) Prior Publication Data
US 2017/0077587 A1    Mar. 16, 2017

(30) Foreign Application Priority Data
May 15, 2014   (DE) ........................ 10 2014 007 141

(51) Int. Cl.
*H01Q 1/20*  (2006.01)
*H01Q 1/24*  (2006.01)
(Continued)

(52) U.S. Cl.
CPC ................. *H01Q 1/20* (2013.01); *H01Q 1/02* (2013.01); *H01Q 1/246* (2013.01); *H01Q 1/42* (2013.01);
(Continued)

(58) Field of Classification Search
CPC .......... H01Q 1/20; H01Q 15/14; H01Q 1/246; H01Q 1/42; H01Q 1/02; H05K 7/20409
See application file for complete search history.

(56) References Cited

U.S. PATENT DOCUMENTS

| 4,640,639 A | 2/1987 | Matsui |
| 5,018,982 A | 5/1991 | Speraw et al. |

(Continued)

FOREIGN PATENT DOCUMENTS

| CN | 101743664 A | 6/2010 |
| CN | 101971425 A | 2/2011 |

(Continued)

OTHER PUBLICATIONS

English translation of the International Preliminary Report on Patentability and Written Opinion of the International Searching Authority dated Nov. 24, 2016, issued in corresponding International Application No. PCT/EP2015/000933.

(Continued)

*Primary Examiner* — Jessica Han
*Assistant Examiner* — Michael Bouizza
(74) *Attorney, Agent, or Firm* — Nixon & Vanderhye P.C.

(57) ABSTRACT

An improved mobile radio antenna suited to radio-frequency connections has a base module that comprises a plurality of mounting sections that each contain an internally threaded hole. An attachment module has mounting sections with through-holes made therein. Spacers are used between the base module and the attachment module. An undercut is provided in the through-hole in the attachment module such that the diameter of the through-hole merges into the undercut with a greater diameter in the plug-in direction, or is provided in a second electrically conductive spacer that is positioned on the attachment module on the side that is (Continued)

opposite the first spacer, the second spacer having a spacer hole with an undercut that broadens in the plug-in direction.

10 Claims, 8 Drawing Sheets

(51) Int. Cl.
    *H01Q 15/14*     (2006.01)
    *H01Q 1/02*     (2006.01)
    *H01Q 1/42*     (2006.01)
    *H05K 7/20*     (2006.01)

(52) U.S. Cl.
    CPC ......... *H01Q 15/14* (2013.01); *H05K 7/20409* (2013.01)

(56) References Cited

U.S. PATENT DOCUMENTS 8,526,195 B2     9/2013     Hublier et al.
2008/0055184 A1*     3/2008     Noro ........................ H01Q 1/42
    343/872
2010/0194662 A1*     8/2010     Saddington ............ H01Q 1/246
    343/872
2010/0243322 A1*     9/2010     Hublier .................... H01R 4/10
    174/84 C

FOREIGN PATENT DOCUMENTS

| | | |
|---|---|---|
| CN | 202495565 U | 10/2012 |
| DE | 84 22 203 | 10/1984 |
| DE | 35 02 263 | 8/1985 |
| DE | 9013234 U1 | 1/1991 |
| DE | 40 29 587 | 3/1991 |
| FR | 2 922 370 | 4/2009 |
| WO | WO 2009/010134 | 1/2009 |

OTHER PUBLICATIONS

International Search Report and Written Opinion of the ISA for PCT/EP2015/000933, dated Sep. 7, 2015, 10 pages.

* cited by examiner

MOBILE RADIO ANTENNA

This application is the U.S. national phase of International Application No. PCT/EP2015/000933 filed 7 May 2015, which designated the U.S. and claims priority to DE Patent Application No. 10 2014 007 141.3 filed 15 May 2014, the entire contents of each of which are hereby incorporated by reference.

The invention relates to a mobile communications antenna according to the preamble of claim 1.

In radio frequency engineering in general, and in the field of mobile communications antenna engineering in particular, screw connections are often used, for instance in order to fasten a metal cover to a metal housing, to mount dipole radiators on reflectors, etc.

It is standard practice today to use reflectors in mobile communications engineering, for instance, that have a housing-like design on their rear side, which is on the opposite side from the radiator side, in which space, for example, can be accommodated the cabling, phase shifters, adjusting devices for the phase shifters, filter assemblies etc. In this case, the reflector can be provided with side-wall webs, which become fixing flanges which terminate parallel to the reflector plane and to which a reflector cover can then be screwed, for instance.

In addition, for mobile communications antennas that meet the packing density of today, active assemblies, such as a radio (RRH) for instance, which are housed in separate housings, are often also mounted on the rear side of the reflector as well, i.e. in the case described, for example, on said reflector cover covering the rear side of the reflector.

It is therefore invariably necessary to fix the relevant parts to one another using a multiplicity of screws.

According to a known standard, for example, on the rear side of the reflector on said fixing flanges, a multiplicity of spaced-apart press nuts can accordingly be press-fitted into holes in the reflector fixing flange in order to create here a pre-fitting arrangement for the subsequent assembly. A cover in which holes are also made can then be placed on the fixing flange. These holes are aligned with the holes in said press nuts. Internal threads are formed in the press nuts themselves, so that suitable screws for fixing the cover can be screwed in from the opposite side.

If, however, the housing of a further component is mounted as well on the cover, as mentioned, then further holes are also made in this housing, usually on laterally protruding flange portions, which holes are aligned with the other holes in order then to screw in, from the rear side of the component to be mounted, screws through the aligned holes and on into said internal thread of the press nuts.

In addition, variants are also known in which, for example, a reflector is in the form of an extruded part. At the relevant mounting or fixing flange, the reflector can be designed to have a greater material thickness, which allows a threaded hole or a threaded blind hole to be made from the mounting side. Thus it is possible to dispense with said press nuts in this case. Even so, press-fit bushes are used in this case, which are pre-fitted by press-fitting to the cover to be attached to the reflector. This is because it is thereby possible, for a multiplicity of corresponding hole connections, to pre-fit the parts such that they can be placed one on top of the other and then screwed together. This often involves screwing in well over 30 or 40 screws into the corresponding threaded holes.

In all these cases, however, it has been found that above all the press-fitting of said press nuts or the press-fitting of said press-fit bushes can cause very small inclined angles, with the result that there are no uniquely reproduced contact points between the reflector, the cover and/or the housing e.g. of an active component. Contact points that cannot be uniquely reproduced, however, invariably lead to altered conditions, which in particular in RF engineering can produce unwanted intermodulations.

The abovementioned, unacceptable tolerance errors can arise not only in the vertical direction but also in the horizontal direction with respect to the components to be fastened to one another in a substantially planar manner. These tolerance errors are generally unacceptable or cannot be overcome.

Thus attempts have also already been made in the past to use embossing processes to form on the relevant mounting portions, on which the parts to be fixed to one another are in direct contact with each other, contact rings or contact recesses, which in each case protrude from the standard fixing plane. These embossing processes, however, can again cause extremely small tolerance errors, which invariably lead to different contact conditions. The same applies for correspondingly protruding and usually annular contact portions, which often were formed in previous housings for active components, filter groups, etc., in the hope of achieving improved contact conditions here.

Finally, when the individual assemblies are joined onto one another and screwed together, surface damage can also be caused to the electrically conductive coatings or to the metal, which damage likewise again results in modified contact conditions. In all these cases, the fabrication process means that there is only very poor control of the contact pressure, again because of different surface areas (diameters of the contact portions).

As became apparent in the course of the invention, all the attempts that have hitherto been disclosed are characterised by a contact geometry that does not deal with the intermodulation problems. Furthermore, additional conditions that likewise cause worse intermodulations can also even arise from a material pairing that is not ideal, i.e. when parts come into contact with one another that are made of different materials or have different surface coatings.

Therefore some notable attempts have been made to avoid potential tolerance-related errors in the manufacture and assembly of such components. The smaller the tolerance errors are meant to be, however, the greater the effort required to achieve this.

The object of the present invention is therefore to create a screw connection suitable for RF engineering that makes it possible to reduce or even to prevent as far as possible intermodulation products.

The object is achieved according to the invention by the features given in claim 1. The dependent claims define advantageous embodiments of the invention.

The solution according to the invention relates to a mobile communications antenna in which a plurality of screw connections are used for rigidly connecting a base module to an attachment module using a spacer. In principle, the solution according to the invention can also be used for the most varied screw connections and supporting connections, but above all in the field of RF engineering such as the field of mobile communications engineering, for example, i.e. in particular in the field of antenna assembly for mobile communications base stations.

According to the solution, in a base configuration of the mobile communications antennas, a spacer, for example a bush-shaped spacer, is provided between two components to be fixed to one another, which components are conductive, so are typically made of metal or are coated in a metal coating.

Thus in antenna engineering, in order to close by a cover, for example in the form of a metal plate, a reflector on the rear side at a distance from the actual reflector plane, a multiplicity of holes are typically provided on two opposite longitudinal sides in a flange forming part of the reflector, in order to fix the cover to the reflector here using 40 or more screws, for example. In order for assembly to be feasible in practice, it is necessary to pre-fit said preferably bush-shaped spacers in the region of the holes in said cover. Pre-fitting makes it possible to place the cover easily on the rear side of the reflector using the spacers and, by screwing in screws, to fix the cover at the mounting points formed there. The pre-fitted spacers are moreover held in a captive manner in their correct position.

In the prior art, this pre-fitting has been achieved by press-fitting suitable bush-shaped spacers, which has contributed to further deterioration in the overall situation, because as a result of the high compressive forces, the mounting areas and mounting portions of the parts to be connected to one another are additionally subject to deformation, marking, indenting etc., whereby the unwanted intermodulation products could be more likely to arise or could be amplified.

According to the invention, said preferably bush-shaped spacers are now pre-fitted without producing high press-fit forces, i.e. are pre-fitted merely by insertion.

In addition, the spacers pre-fitted in this captive manner can be pre-fitted with a small amount of play, which preferably acts both in the axial direction and in the transverse direction, for example in two transverse directions provided perpendicular to the axial direction. It can be sufficient in this case that this play equals only a fraction of a millimeter. This preferably small amount of play provides the additional advantage during final assembly that potential tolerance errors can thereby be corrected easily, because during screw-fitting, the spacers can automatically assume the optimum position, with the result that the parts to be placed on one another and to be screw-connected can be connected to one another in as plane-parallel and flat a manner as possible while sandwiching said spacer in place. This prevents or at least greatly reduces the unwanted intermodulations that invariably arise in the prior art.

According to the invention, the spacers have an insertion portion, which extends into the through-hole of an attachment module (such as a cover to be screwed onto a reflector, for example). Here, the insertion portion has a retaining portion, which is attached preferably at the front in the insertion direction and protrudes in the radial direction, and which engages in an undercut formed in the through-hole in the insertion direction. The spacer is thereby pre-fitted, if applicable with at least a small amount of play, and thereby held in a captive manner.

It is likewise possible that the radially protruding retaining portion on the insertion portion of the spacer extends through the fixing hole and protrudes in the insertion direction on the opposite side of the attachment module, albeit then engaging there in a second spacer bush, which is positioned on this side of the attachment module, in a suitable hole, and terminating in the region of an undercut formed there in the hole. Thus the spacer effectively consists of a combined spacer having two spacer halves, which come to sit above and below the preferably planar attachment module (for example in the form of a reflector cover) to be affixed. By virtue of said pre-fitting, with the attachment module to be affixed held in a sandwich, the two halves of the combined spacer are held against one another and hence pre-fitted to the attachment module itself in a captive manner.

For the purpose of screw-fitting, the entire assembly comprising the attachment module, for example in the form of the reflector cover, and the single-element spacer bush or the two spacer bushes forming a "combined bush" can be placed on the corresponding mounting surfaces of a base module, for instance in the form of the mounting flange on the rear side of a reflector, in order then to insert from the side opposite the base module a multiplicity of screws through the holes in the attachment module and the spacer bushes, and to screw said screws into the internal thread provided in the base module.

It is also possible in this case for additional assemblies or components that are to be affixed, referred to below as component modules for short, to be mounted as well on the top face of the second half of the combined spacers or directly on the top face of the attachment module (if only a single-element spacer is used between attachment module and base module). These component modules, for instance in the case of mobile communications antennas for base stations, can consist of what are known as remote radio heads (RRH), which are housed in a separate component housing having corresponding support flanges into which are likewise made the corresponding holes in the same sequence as the holes in the attachment module and base module.

Thus the present invention is suitable, as explained, for mobile communications antennas, but in principle can also be used generally in RF engineering in the context of screw connections for which, for example, a base module or reflector module is meant to be rigidly connected at least to an attachment module.

Furthermore, additional attachment modules can be affixed as well.

Thus according to the invention it is possible to overcome a plurality of position tolerance errors both in the axial direction and in the transverse direction thereto. Above all, unlike in the prior art, there is no longer any compressing of parts that causes deterioration in the mounting conditions and especially in the contact conditions. Since press-fit parts do not need to be press-fitted into holes using high levels of force, then at these points also no damage to the metal surfaces occurs that causes intermodulations to arise or be amplified.

Finally according to the invention, it is also possible to achieve better control of the contact pressure by virtue of the portions that lie on one another having the same surface area (diameter).

Thus overall a contact geometry and also especially a material pairing are obtained that do not create intermodulation problems.

Further advantages are obtained in particular when not just two modules but three modules are meant to be screwed together, for example in the form of a reflector for holding a multiplicity of radiators and radiator elements, and a reflector cover and an additional component, for example in the form of a radio.

By using a "combined spacer", so for instance in the form of a second spacer bush in addition to a first spacer bush, it is possible in this case, by suitable dimensioning of these spacer bushes, to produce in the axial direction almost every desired axial distance considered optimum, for example, between the cover and the bottom face of the radio housing located thereabove. In addition, the individual components and modules, if applicable, can be made of different materials or be provided with different electrically conductive and/or metallic coatings. The same applies to said spacers. In the case of the combined spacers, both parts of this combined spacer can likewise be made of different metals or be coated by different metals or alloys. So for instance, the one half of the spacer can be silver-plated and the second half, which interacts therewith and is fixed thereto, can be galvanised. Further different metal pairings are possible.

The embodiment according to the invention also allows that the modules to be fixed to one another do not need to be provided with contact rings or contact embossings that are raised compared with the usual contact surface and hence protrude, which ultimately could again contribute to deterioration of the contact conditions as a result of the relevant formation of these protruding contact rings. Thus also no further surface damage occurs either when screwing together the individual modules or when manufacturing the modules to be connected to one another, because there is no need to form any additional protruding contact embossings.

Thus the invention achieves overall better control of the contact pressure of the components and modules resting against one another and to be connected. In addition, the surface areas that come into contact can be produced to be the same for all components, whereby better, producible electrical contact conditions are possible while preventing or greatly reducing intermodulation.

Screw connections of the most varied design are in general well-known.

For example, U.S. Pat. No. 5,018,982 describes a screw connection comprising spacers and, positioned inside the spacers, sleeve elements through which a long screw connection passes. Between the spacers are arranged circuit boards in different parallel planes spaced apart by a distance equal to the height of the spacers. The spacers and the circuit boards are accordingly galvanically isolated from each other. The problem of avoiding intermodulation products inherently does not arise.

DE 40 29 587 A1 discloses an assembly using a screw connection which comprises a washer placed on a bolt in order to provide electrical and thermal isolation between the bolts and a water-heater housing through which the bolts pass. Again this does not relate per se to a problem and solution for preventing intermodulation products.

DE 35 02 263 A1 also discloses just a retaining mechanism for circuit boards, which are held by a screw connection which holds the circuit boards apart at a parallel separation from one another, so again in this case there is no galvanic or other electrical connection between the spacers and the circuit boards.

Therefore these prior publications also do not disclose any suggested solutions for preventing intermodulation products in RF engineering.

In this context, DE 84 22 203 U1 also describes a comparable solution, which is intended to be used to anchor planar modules, for instance circuit boards on support plates, in electrical equipment by means of a specific screw connection.

Finally, U.S. Pat. No. 8,526,195 B2 discloses a further connection technology that differs fundamentally therefrom. In this case, a conductive plate containing a through-hole is connected to two sleeve parts, wherein a cylindrical extension of the sleeve part resting on the one side of the conductive plate passes through the hole in the conductive plate and an aperture in the opposite sleeve part, and extends to the height of an increasingly conically flared receiving space in the opposite sleeve part. The sleeve-shaped extension of the first cylinder part can be bent into this space in order to fix both cylinder parts to the plate. Such connection technologies, however, invariably produce unwanted intermodulation products in RF engineering.

The invention is described in greater detail below with reference to drawings, in which in particular:

The embodiment shown depicts a base module 1, an attachment module 3 to be fixed thereto and a component module 5, which can all be fixed to one another using a multiplicity of screws.

In the embodiment shown, said base module 1 consists of a reflector 1' such as can be used, for instance, in mobile communications antennas in a base station. The attachment module 3 consists of a reflector cover 3' in this embodiment. The component module 5, for example, consists of an active component in the form of a radio 5', i.e. in the form of a "remote radio head RRH", such as can likewise be used in a mobile communications antenna device or installation (base station).

Figure 1:
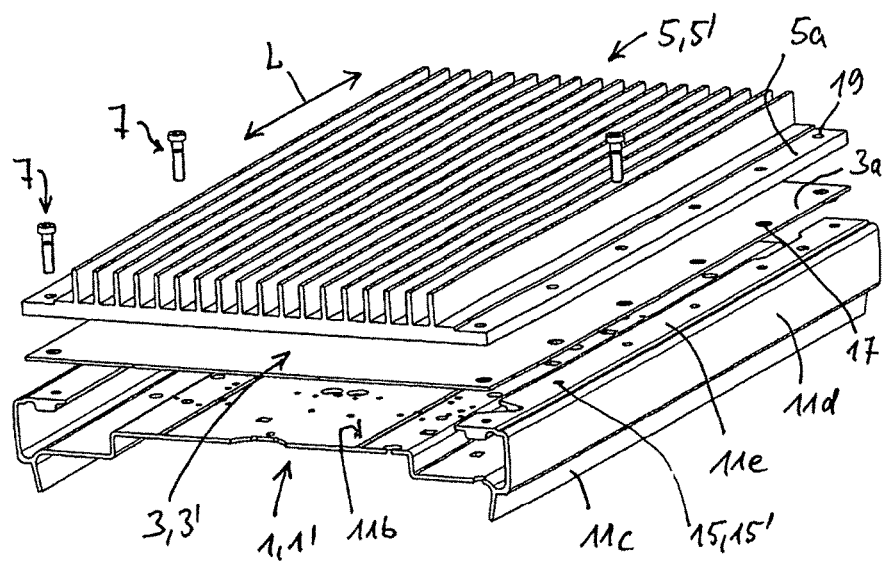
FIG. 1 is a three-dimensional exploded view of three components to be connected, viewed from an angle showing the top face of a component module.
Figure 2:
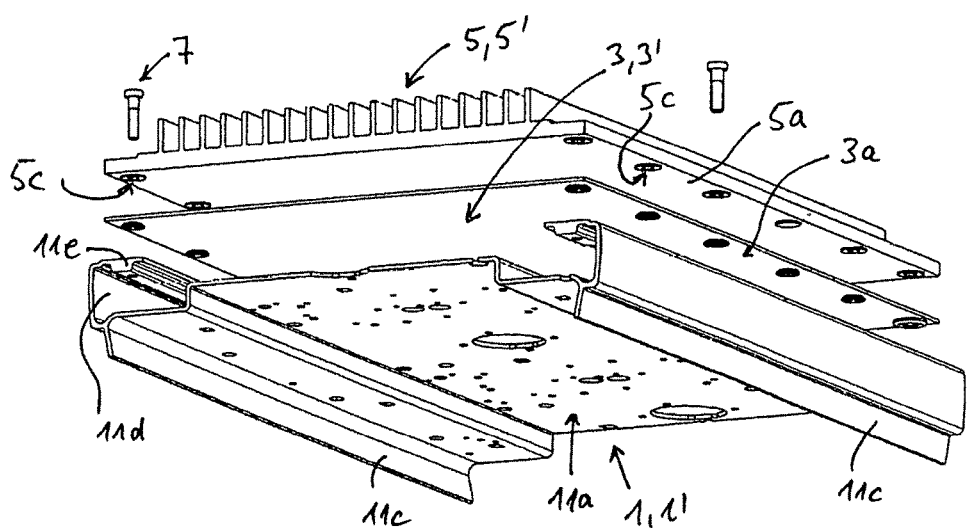
FIG. 2 is a drawing that corresponds to FIG. 1 but in a view towards the bottom face of a base module.

The corresponding modules 1, 3, 5 typically extend over a length L, which is considerably longer than in the exploded perspective view of FIG. 1 or 2.

Figure 3:
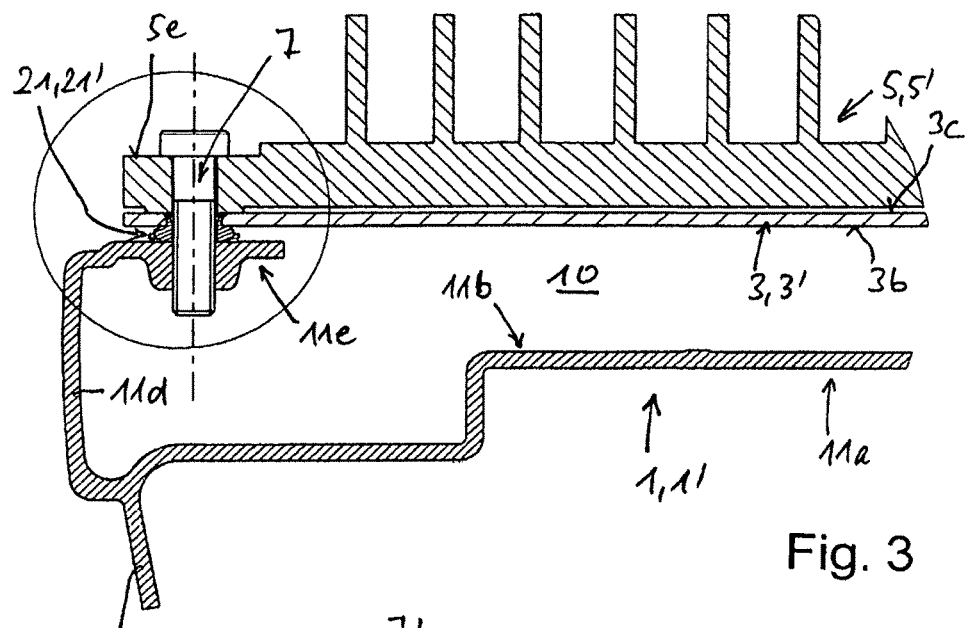
FIG. 3 is a cross section, at right angles to the longitudinal direction, of a portion of the modules to be connected that are shown in FIGS. 1 and 2, which modules are in the assembled state.

In FIGS. 1, 2 and 3, the side lying underneath in each of the figures forms the front side 11a of the base module 1, here in the form of the reflector 1'. Spaced in the longitudinal direction L are mounted on this front side 11a typically dipole radiators, dipole squares, vector dipoles, patch radiators etc., which can radiate and/or receive in one polarisation or in two mutually orthogonal polarisations in one, two or more frequency bands. Reference is made here in this regard to well-known solutions.

In the embodiment shown, the base module 1 in the form of the reflector 1' comprises side webs 11c, which protrude towards the front side 11a, and backward-oriented side webs 11d, which in turn, on both opposite longitudinal sides, terminate in mounting flanges 11e that extend towards each other. Thus these mounting flanges 11e are formed on the rear side 11b of the base module 1, here in the form of the reflector 1'.

On the rear side of this base module 1 shown in the form of the reflector 1', a clearance space 10 (FIG. 3) is thus formed between the mounting flange 11e or the attachment module 3, here preferably in the form of the reflector cover 3', and the surface on the rear side 11b of the base module 1, in which space various module components can be housed. In the case of an antenna or mobile communications antenna, the cable connections, in particular coaxial cables, leading to the radiators are housed here together with phase shifters, rods or other adjusting devices for setting or adjusting the phase shifters etc. This provided space 10 can then be covered and closed by attaching a reflector cover 3', which reflector cover 3' usually has a width equal to the width of the base module 1 located thereunder, in this case in the form of the reflector 1'. Thus in general, an attachment module 3 is attached and screwed onto the side 11b of the base module 1, which side is on the rear in this case.

The drawings in FIGS. 1 to 5 show that the attachment module 3, here in the form of the reflector cover 3', does not lie directly on the base module 1, here in the form of the reflector 1', but with an interposition of a spacer 21, here in the form of spacer bushes 21'.

The corresponding spacer bushes 21' are provided at each of the positions at which the attachment module and the component module are provided with corresponding holes.

It is clear from the embodiment shown that the base module 1, here in the form of the reflector 1', is provided with a multiplicity of holes 15 on the mounting flanges 11e shown. The base module 1 is here preferably formed as an extruded part or a strip-cast part such that the mounting flange 11e has a thickened material portion 11f. This provides the facility for making the holes 15 provided there from the rear side in the form of blind holes, for instance, and to provide said holes with an internal thread 15'. In this context, the holes 15 are also referred to as threaded holes 15, irrespective of whether they are in the form of through-holes or blind holes. In the embodiment shown, said threaded holes 15 are formed as through-holes in the associated mounting flange 11e, with the result that the lower end of the screws can protrude beyond the fixing flange 11e.

Aligned with these threaded holes 15 in the same pitch sequence are made holes 17, designated as through-holes, on the corresponding edge 3a of the attachment module 3, here in the form of the reflector cover 3'. The dimensions of said holes are designed such that the respective screws 7, shown in FIGS. 1 and 2, having associated screw shaft 7', on which is formed an external thread at least along part of its length, can easily pass through.

In order to be able to perform the assembly easily, the spacers 21, preferably embodied in the form of spacer bushes 21', must be pre-fitted to the attachment module 3, i.e. must be attached at least in a captive manner, in order to be able to screw the attachment module prepared in this way to the base module 1 using the spacer bushes 21' pre-fitted thereto in the region of the through-hole 17. It is clear especially from the magnified cross sections shown in FIGS. 4 and 5 that the spacers 21, here in the form of the spacer bushes 21', have an insertion extension 21a, which has an external diameter that is less than or equal to the internal diameter of the through-hole 17 in the attachment module 3.

Said insertion extension 21a comprises at the front in the insertion direction 20, preferably at the leading end of the insertion extension 21a, a protrusion 21c, which is flared in the radial direction, which in the embodiment shown can be made in the form of a circumferential annular termination having a larger external diameter than the external diameter of the insertion extension 21a.

In this region, the attachment module 3 is formed with an undercut 31 extending towards the top face 3c at a distance from its bottom face 3b, which undercut is designed to flare conically in the insertion direction in the embodiment shown.

After insertion of the insertion extension 21a of the spacer 21 into the through-hole 17, the here slightly flared radial protrusion 21c of the spacer is slightly compressed or pressed together so that it can pass through the through-hole 17 during insertion until, on reaching the undercut 31, this radial protrusion 21c can expand slightly again (because of the elastic deformation) and thus the radial protrusion 21c comes to lie in the region of the undercut 31 in the attachment module 3, which undercut has a larger cross-section than the through-hole 17.

The described radial protrusion 21c can also be referred to in this regard as an annular catch. In this context, the annular catch can also be provided with slots or notches spaced around the circumference over a partial axial length, with the result that the radial protrusion 21c is not in the form of a substantially continuous annular catch but instead with the result that a multiplicity of finger-like catches are formed spaced around the circumference in order to make the latching or snap-fitting operation easier in the region of the undercut. The spacer 21 is thus designed to be elastic or partially elastic or at least slightly elastic at least in the region of its insertion extension 21a or at least in the region of the radial protrusion 21c, in order to be able to perform easily the insertion through the hole until the undercut is reached. This also applies to the further embodiments which are explained below and which contain some modifications.

In order to create the elasticity or partial elasticity in the region of the radial protrusion 21c, it is provided that here the insertion extension, especially at its leading end 21b, becomes increasingly thinner in terms of the material thickness. For this purpose, the insertion extension 21a, at a partial height towards its leading end, is preferably designed to have wall segments that become increasingly thinner or thinner in portions, for which purpose the inside of the insertion extension changes from its substantially cylindrical hole 16 into an aperture cross-section 16' that flares conically towards the leading insertion end 21b. This enhances the creation of at least a certain partial elasticity for inserting the radially protruding catch portion or snap-fit portion 21c. This applies not only to the present embodiment shown in FIGS. 1 to 5 but also to the subsequent embodiments.

Said spacer 21 in the form of the spacer bush 21' is thereby fastened to the attachment module 3 in a captive manner, i.e. pre-fitted and held in a captive manner here. This construction hence creates a type of pre-fitting means.

In addition, at the bottom end of the insertion extension 21a, the spacer 21, here in the form of the spacer bush 21', changes into a bush base 21d that has a wider radial extent, thereby forming a spacer stop 21e, which limits the maximum insertion depth of the insertion extension 21a in the through-hole 17. In this case, the length or height H of the insertion extension engaging in the hole 17 is less than or equal to the height or thickness D of the attachment module 3, i.e. the material thickness D formed between the bottom face 3b and the top face 3c in the region of the through-hole 17.

The dimensions of the spacer, of the insertion extension, of the diameter of the through-hole etc. are designed to fit one another such that the corresponding spacer 21, here in the form of the spacer bush 21', is pre-fitted at least with a small or extremely small amount of play, with the result that during subsequent final assembly, the individual parts can automatically assume their optimum screw-fitted position on screwing in the screws. It is accordingly the case here that a tolerance play is provided between the spacer and the hole or attachment module 3, which allows a relative movement preferably in a direction parallel to the bottom face 3b of the attachment module 3 and in particular in two mutually orthogonal directions parallel to said bottom face and/or also preferably perpendicular thereto in the insertion direction, which play is greater than 0.001 mm, in particular is greater than 0.005 mm, 0.01 mm, 0.15 mm, 0.2 mm etc. A play greater than 1 mm is basically not necessary.

In the embodiment shown, however, not just the attachment module 3 is screwed onto the base module 1, but at the same time a component module here in the form of an active component, for example in the form of a radio housing 5', is also attached as well by said screws 7.

The component module 5 accordingly also comprises on its two opposite fixing edges 5a (in part also referred to as a fixing flange 5a), in the same pitch sequence, further insertion holes 19, which are formed on the laterally protruding fixing flanges or housing flanges 5a. In the embodiment shown, seating collars 5c are formed on the bottom face 5d of the component module 5 in the region of each of the insertion holes 19, with the result that the component module 5 does not rest directly on the top face 3c of the attachment module 3 by its entire bottom face 5b but only by the bottom face 5d of the seating collars 5c.

Since prior to joining together all three components, the centre component, i.e. the attachment module 3, has already been fitted with the aforementioned spacers in a captive manner in the region of each of its through-holes 17, the three modules can now be placed one on top of the other and aligned such that all of the aforesaid holes, i.e. the insertion holes 19 in the component module 5, the through-holes 17 in the attachment module 3 and the threaded holes 15 in the base module 1, are aligned with one another.

Figure 4:
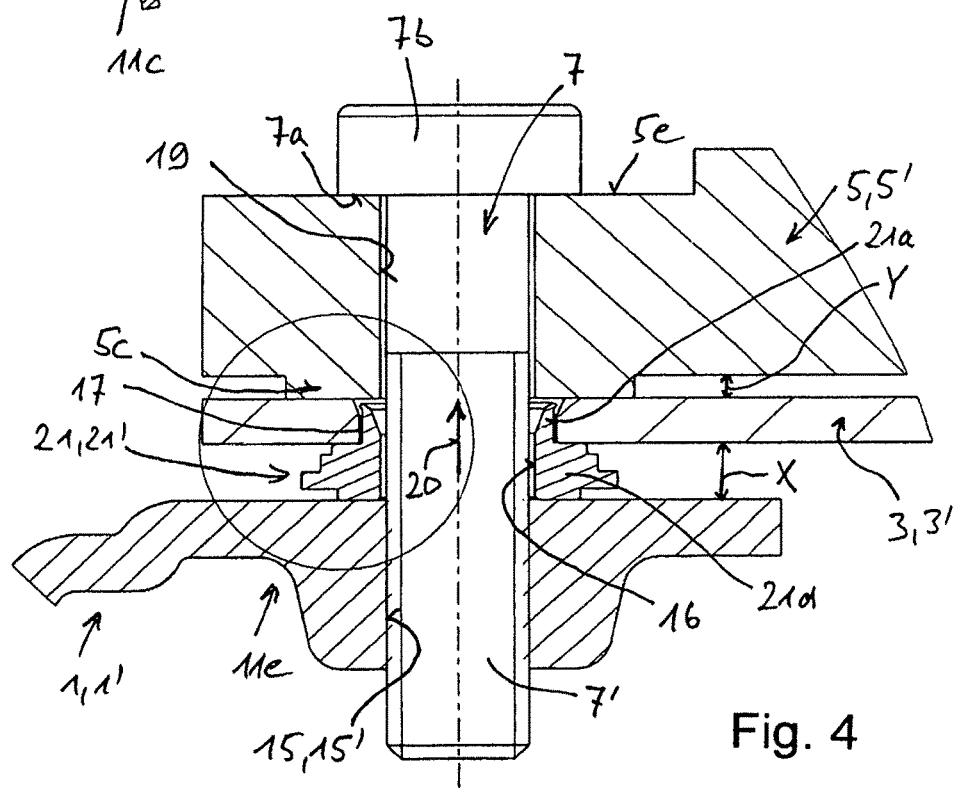
FIG. 4 is a magnified detail of the cross-sectional region encircled in FIG. 3.
Figure 5:
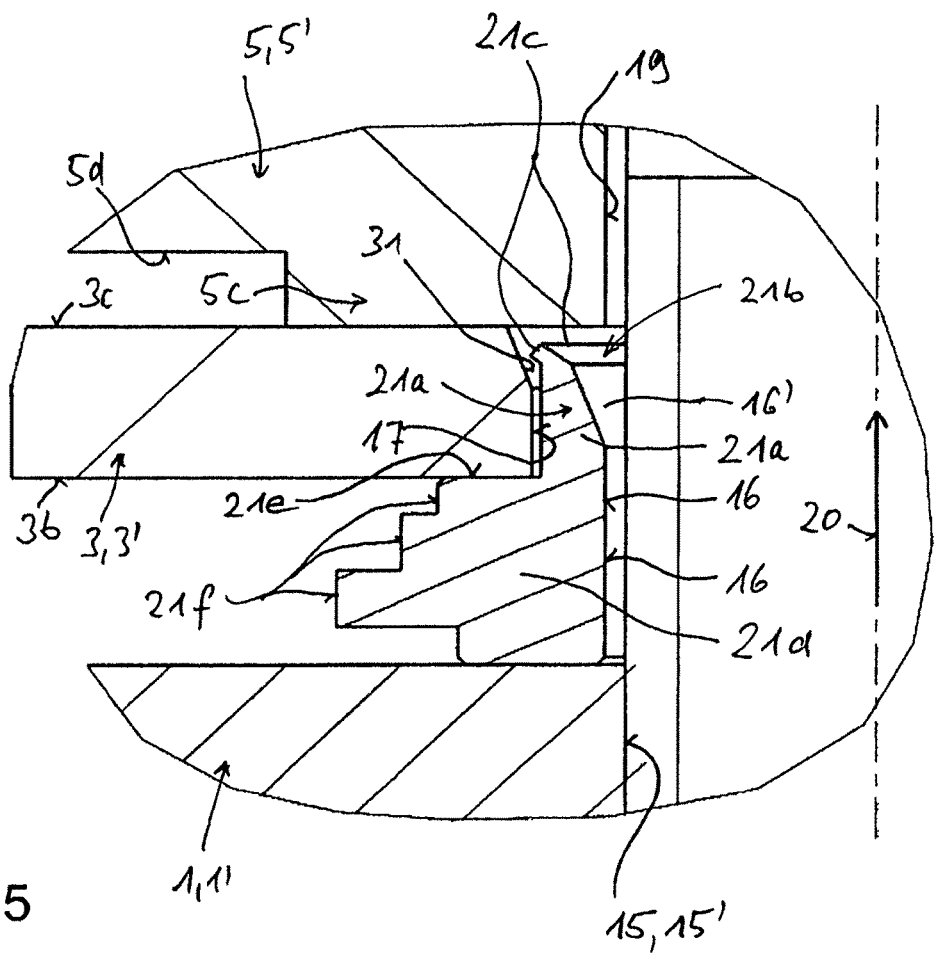
FIG. 5 is a detail at even greater magnification of the cross-sectional region encircled in FIG. 4.

This corresponds to the drawings shown in FIGS. 3 to 5, in which in this position the aforesaid screws can then each be inserted through the insertion hole 19 and the through-hole 17 located thereunder as far as the threaded hole 15, and then can be screwed into the flange-shaped edge of the base module by screw-tightening in the internal thread 15', until the underside 7a of the relevant screw head 7b rests on the top face 5e of the component module 5 or of the fixing flange, and all three components can be screwed firmly together.

The overall design shown results in significantly improved conditions compared with conventional solutions while having an extremely simple design and embodiments. Above all, intermodulations are thereby reduced or even entirely prevented. This can accordingly also be referred to as an intermodulation-proof screw connection.

Finally, the materials of the individual modules and/or also the material of the spacer can be made of the same material or even from different materials. Above all, by a correspondingly suitable choice of the material of the spacer or of a material suitable therefor for a surface coating of the spacer, it can be ensured that this selected material is particularly suitable both with regard to the material of the base module and with regard to the material of the attachment module and/or the material of the component module, if these are meant to be made of different materials or consist of different surface coatings.

Figure 6:
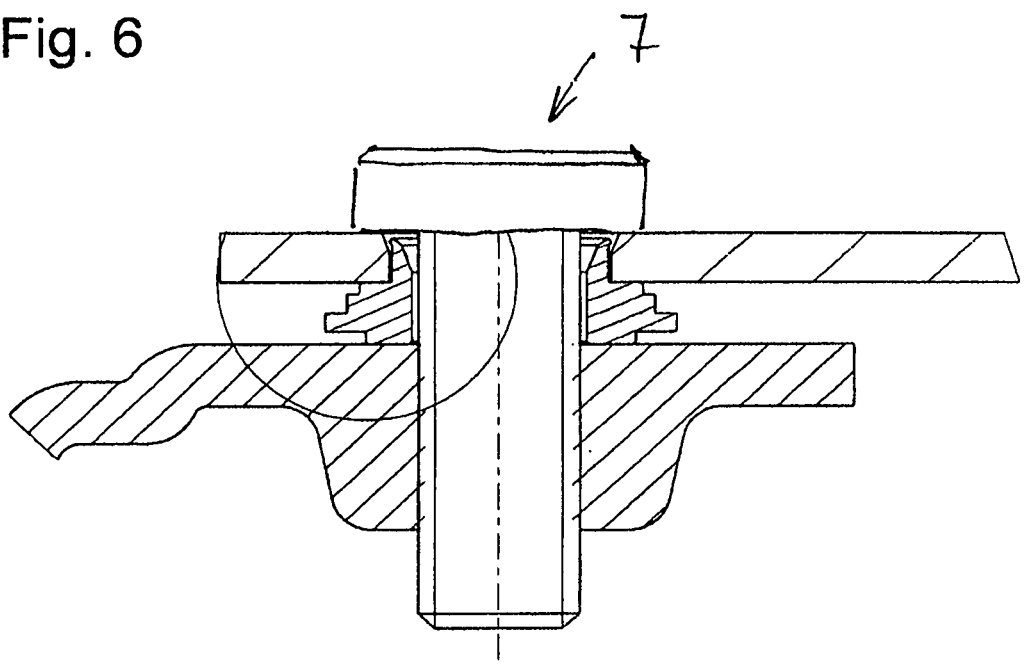
FIG. 6 is a cross-sectional drawing corresponding to FIG. 4 but showing just an attachment module and a base module screw-fixed to each other using a spacer bush according to the invention pre-fitted in a captive manner.

FIG. 6 is now used to show schematically that using the described design, the relevant spacer 21 can also be used to fix the attachment module 3 on its own to the base module 1, i.e. without the component module 5 shown with reference to FIGS. 1 to 5. Once again in this case, the captive pre-fitting of the spacer in the relevant through-hole 17 in the attachment module 3 proves advantageous.

It is also mentioned finally that the rings, which increase in width like steps, or annular widened segments, 21f on the outside of the spacer bushes 21' are not absolutely necessary. These shoulders, however, may allow attachment modules 3 having different hole diameters to be placed on different stepped shoulders, whereby ultimately also the distance X (FIG. 4) between the top face of the base module 1 and the bottom face of the attachment module 3 can be preset to different values without needing different spacers 21 for this purpose.

Reference is made below to a second embodiment shown in FIG. 7 ff.

Figure 7:
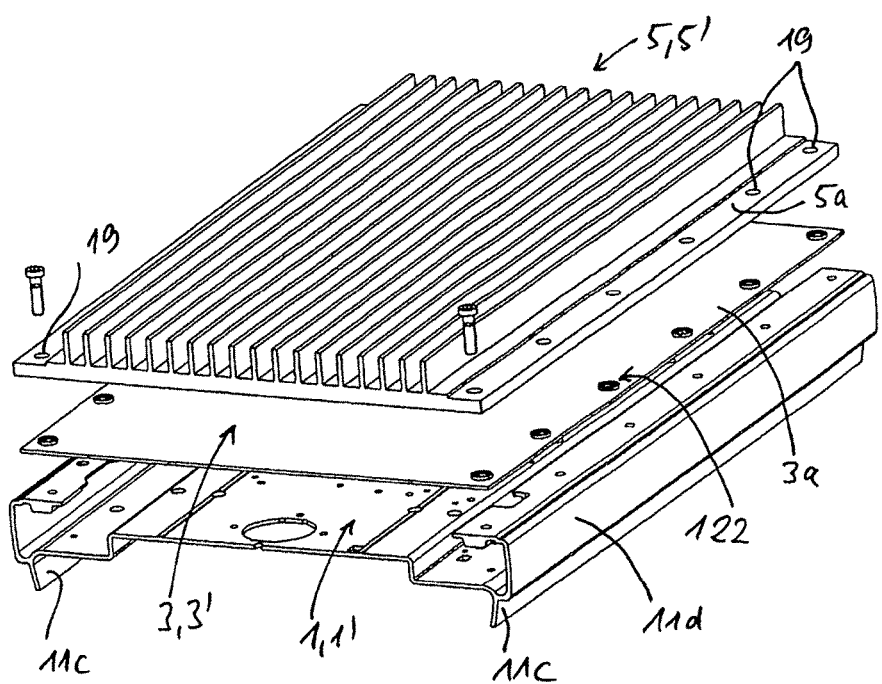
FIG. 7 is a drawing corresponding to FIG. 1 showing a slightly modified embodiment from that in FIG. 1.
Figure 8:
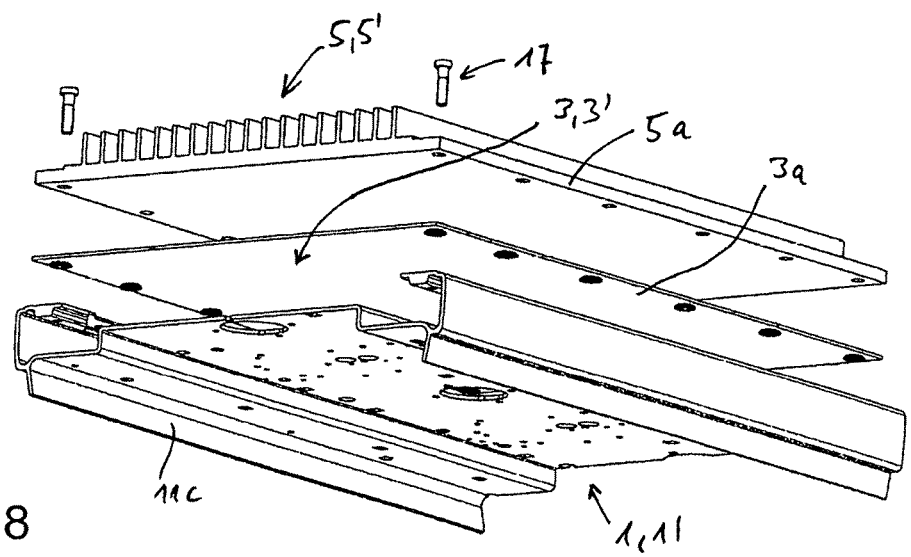
FIG. 8 is a drawing corresponding to FIG. 2 but showing a slightly modified embodiment from that shown in FIG. 2.

The embodiment shown in FIG. 7 ff. differs from the previous embodiment only in that the component module 5 in the screw-fitted state does not rest directly by its seating collars 5c on the top face of the attachment module 3, but a further or second spacer 121 in the form of a spacer bush 121' is provided here between the attachment module 3 and the base module 1. The spacer 21 described initially, which can also be referred to as the first spacer 21, effectively forms with the further or second spacer 121 a combined spacer K.

Figure 9:
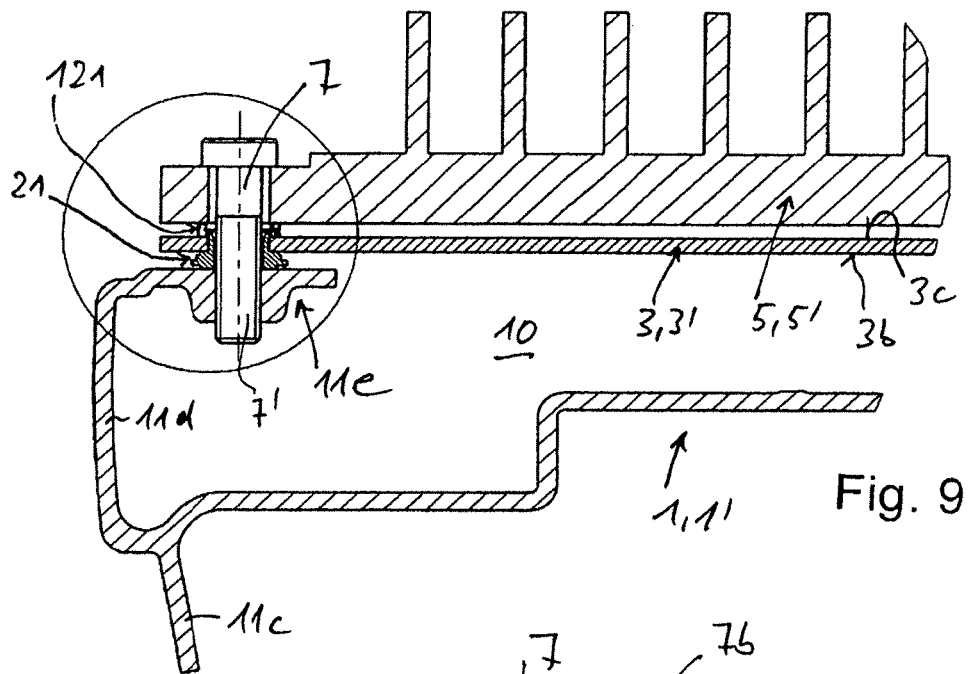
FIG. 9 is a cross section of a portion of the modified embodiment.
Figure 10:
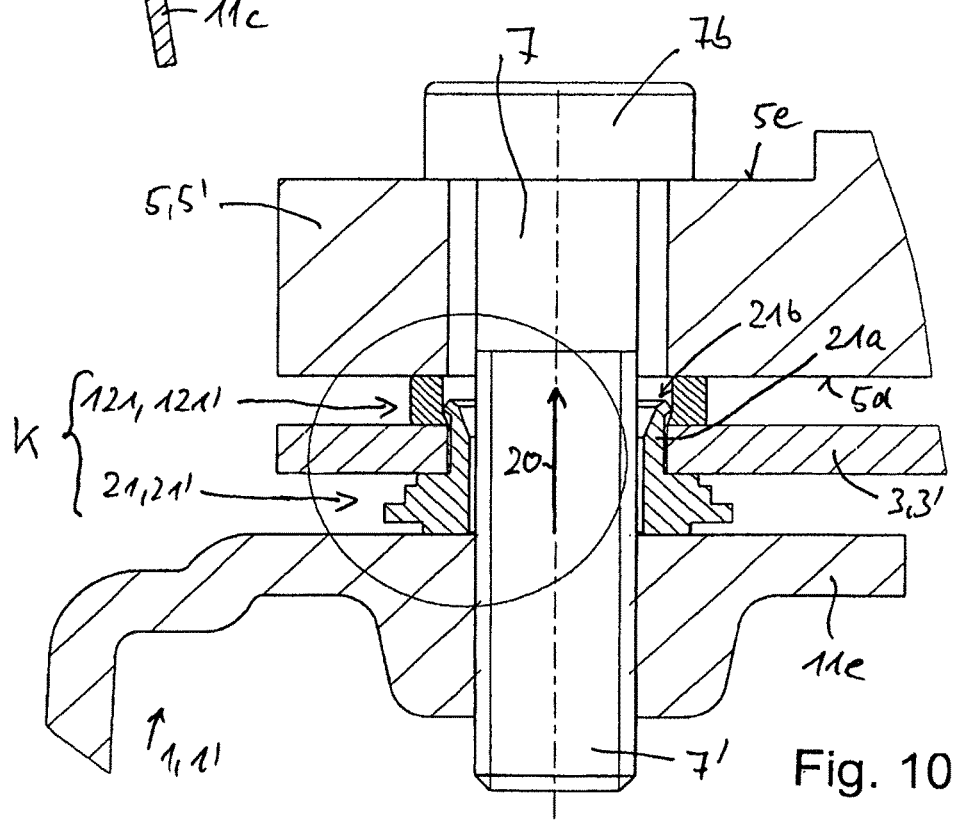
FIG. 10 is a magnified cross section of the cross-sectional region encircled in FIG. 9.
Figure 11:
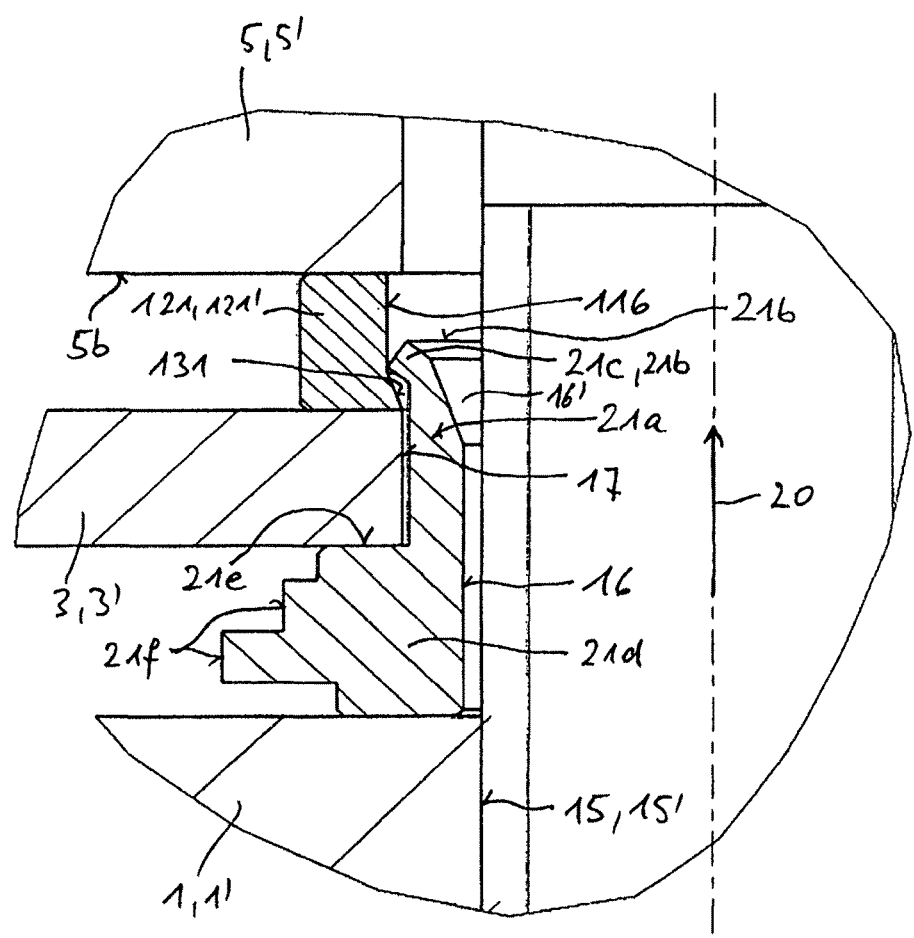
FIG. 11 is a detail at even greater magnification of the cross-sectional region encircled in FIG. 10.

As is evident in particular from the cross sections shown in FIGS. 9, 10 and 11, the height or length H of the insertion extension 21a of the first spacer 21 is now designed to be larger, and has in this case a dimension that is greater than the thickness D of the through-hole 17 through which the insertion extension extends. In other words, the previously described radial protrusion 21c on the insertion extension 21a of the spacer 21, here designed in the form of a spacer bush 21', terminates in a plane above the top face 3c of the attachment module 3.

Above this top face 3c of the attachment module 3, however, is positioned said second spacer 121, here in the form of a second spacer bush 121', which has an internal hole 116, which in a direction opposite to the insertion direction 20, changes from a hole diameter that is larger than the hole diameter of the through-hole 17 in the attachment module 3 into a conically tapered portion, thereby forming an undercut 131. At the end of this undercut 131, which in the insertion direction changes from a narrow hole diameter to a larger hole diameter, comes to sit the radial protrusion 21c of the insertion extension 21a after the spacer 21 is inserted and plugged in, with the result that the two spacers 21 and 121, i.e. the "combined spacer" K, come to rest holding the mounting portion or drilled-hole portion of the attachment module 3 in a sandwich, whereby the attachment module 3 is pre-fitted with the two spacers 21 and 121 against one another in a captive manner.

In the embodiment shown in FIGS. 1 to 6, the diameter in the region of the radial protrusion 21c of the insertion extension 21a, i.e. the external diameter, at least in the un-deformed state, has a size that is at least slightly larger than the hole diameter in the attachment module 3 in that region in which an undercut 31 is not provided.

In the embodiment shown in FIG. 7 ff., the external dimension or external diameter of the radially protruding protrusion 21c, i.e. what is referred to as the annular catch (with or without finger-like catches formed there), is likewise at least slightly larger than the diameter dimension of the through-hole 17 in the attachment module 3. The adjoining second spacer 121 in this case has in the region of the through-hole an internal dimension which preferably initially increases in size starting from the hole diameter 17 in the attachment module 3 through the undercut 131 that is immediately adjacent in the insertion direction, and then changes into a hole 116 having an internal diameter that is greater than the internal diameter of the hole 17 in the attachment module 3.

Once such a pre-fitting has been made, the three modules 1, 3 and 5, as explained with reference to the first embodiment, can be positioned on one another in corresponding alignment, and positioned such that the corresponding holes in the individual modules are each aligned with one another. In the cross section shown in particular in FIG. 7 ff., the aforesaid screws 7 can then be inserted from the rear side of the component module 5 through the holes and then screwed in in the threaded hole 15 in the base module 1, which threaded hole is bottommost in each case, until the underside 7a of the screw head of the screws 7 rests firmly on the top face of the component module 5 and all three modules are fastened firmly against one another, producing sufficient contact pressures.

Since again in this case, the aforesaid combined spacers 21, 121 have the at least small amount of play, on tightening the screws it is ensured that all the aforesaid components including the two spacer bushes 21 and 121 can perform, if necessary, slight relative movements in order to produce uniquely reproduced contact conditions, which can counteract the creation or amplification of intermodulation.

In addition in this embodiment, an additional separation Y is also produced between the bottom face of the component module 5 and top face of the attachment module 3. Moreover, it is not necessary in this embodiment for the seating collars 5c protruding in the mounting direction to be formed on the bottom face 5d of the component module 5, as is preferably provided for the first embodiment. In the present embodiment it is likewise possible to provide in the component module 5 the raised seating collars 5c provided for the first embodiment on the bottom face of said module. Preferably, however, in particular for the last-mentioned embodiment, these can be dispensed with, which in turn provides advantages for production.

Figure 12:
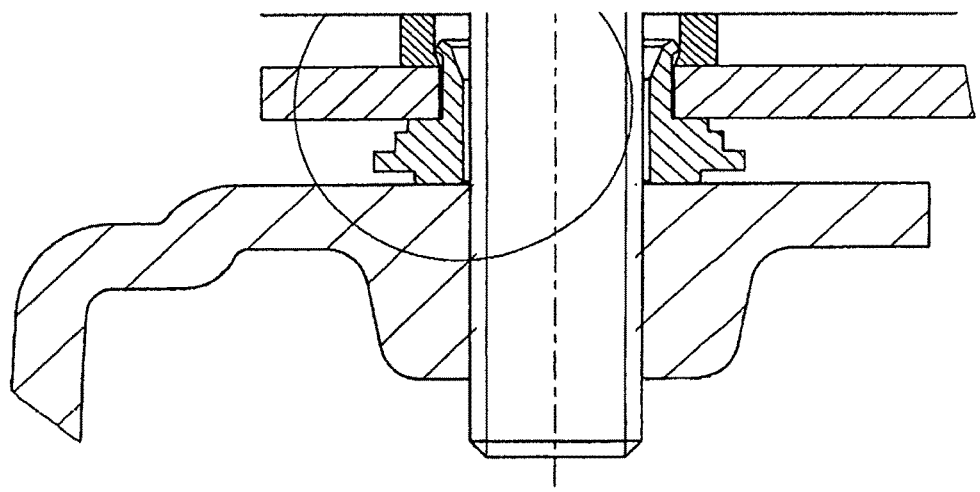
FIG. 12 is a cross-sectional drawing corresponding to FIG. 4 but showing just an attachment module and a base module fixed to each other using a combined spacer bush according to the invention, which has a first spacer and a second spacer, pre-fitted in a captive manner.

FIG. 12 is used to show a slight modification, similar to the cross section shown in FIG. 6, in which, using the combined spacer, i.e. the first and second spacers 21, 121, a corresponding screw connection can also be made just between the base module 1 and the attachment module 3. In this case, the underside 7a of the screw head 7b would rest on the top face of the second spacer 121. It is explicitly specified that the base module 1 and the attachment module 3 are electrically conductive, are usually made of metal and/or have an electrically conductive coating, i.e. surface coating or outer layer. In the present field, the screws used are always made of metal or in particular consist of (stainless) steel screws, although the advantages according to the invention can also be achieved in principle when using screws made of plastics material.

The invention claimed is:
1. Mobile communications antenna comprising:
a base module, comprising a multiplicity of mounting portions, in each of which is formed a threaded hole,
an attachment module, comprising mounting portions containing through-holes therein,
spacers between the base module and the attachment module,
a screw connection between the base module and the attachment module and the spacers provided between the base module and the attachment module, the base module, the attachment module and the spacer being electrically conductive,
spacers comprising spacer holes, which are aligned with the through-holes in the attachment module and with the threaded holes in the base module,
screws screwed into the threaded holes in the base module, the screws extending through the through-holes and the spacers,
a spacer base and an insertion extension that protrudes from the spacer base in the insertion direction by which the spacers are pre-fitted on the attachment module against one another in a captive manner already in an unassembled state, the pre-fitted spacers being configured and dimensioned to space the attachment module from the base module in an assembled state to provide a clearance therebetween,
the insertion extension comprising a radial protrusion lying offset from the spacer base in the insertion direction,
the radial protrusion engaging into an undercut,
the undercut being:
a) provided in the through-hole in the attachment module such that the diameter of the through-hole changes in the insertion direction into the undercut of larger diameter, or
b) provided in a second electrically conductive spacer, which is positioned on the attachment module on the opposite side from the first spacer, wherein the second spacer comprises a spacer hole having an undercut that is flared in the insertion direction.

2. Mobile communications antenna according to claim 1, wherein additionally fixed to the attachment module, on the opposite side from the base module, is a component module, for which purpose the component module is provided with insertion holes, which are aligned with the through-holes in the attachment module and with the threaded holes in the base module, wherein in the assembled state, the undersides of the screw heads rest at least indirectly on the opposite side of the component module from the attachment module.

3. Mobile communications antenna according to claim 1, wherein the insertion extension of the spacer is structured to be inserted into the through-hole in the attachment module as far as a stop.

4. Mobile communications antenna according to claim 3, wherein the spacers comprise a stop coming from the insertion direction, which is formed by the spacer base, which protrudes from the insertion extension in the radial direction perpendicular to the insertion direction, wherein the stop, on the insertion extension reaching the maximum insertion depth in the through-hole, rests against the bottom face of the attachment module.

5. Mobile communications antenna according to claim 1, wherein the spacers comprise a multiplicity of spacer bushes containing spacer holes, which around their external circumference comprise at least two portions, which increase in width like steps, of different external diameter.

6. Screw connection according to claim 1, wherein the insertion extensions of the spacers have an insertion height by which they protrude beyond the insertion extension, wherein the insertion height is less than or equal to the thickness of the attachment module in the region of its through-hole.

7. Mobile communications antenna according to claim 1, wherein the insertion extensions of the spacers have an insertion height by which they protrude beyond the insertion extension, wherein the insertion height is greater than the thickness of the attachment module in the region of its through-hole, wherein the radial protrusion is disposed in the undercut of the second spacer.

8. Mobile communications antenna according to claim 1, wherein the insertion extension is designed at its radial protrusion to have at least in portions a thinner material cross section in order to produce at least a partial elasticity.

9. Mobile communications antenna according to claim 1, wherein the first and/or second spacer comprises a conductive surface coating or is made of metal.

10. Mobile communications antenna according to claim 1, wherein the base module, the attachment module and/or the spacer are made of the same material or of different materials.

* * * * *